United States Patent
Braganca et al.

(10) Patent No.: US 9,852,782 B2
(45) Date of Patent: Dec. 26, 2017

(54) TILTED SYNTHETIC ANTIFERROMAGNET POLARIZER/REFERENCE LAYER FOR STT-MRAM BITS

(71) Applicant: HGST Netherlands B.V., Amsterdam (NL)

(72) Inventors: Patrick M. Braganca, San Jose, CA (US); John C. Read, San Joes, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 14/841,675

(22) Filed: Aug. 31, 2015

(65) Prior Publication Data

US 2017/0062700 A1    Mar. 2, 2017

(51) Int. Cl.
 *H01L 29/82* (2006.01)
 *G11C 11/16* (2006.01)
 *H01L 43/08* (2006.01)

(52) U.S. Cl.
 CPC ............ *G11C 11/161* (2013.01); *H01L 43/08* (2013.01)

(58) Field of Classification Search
 CPC ..... H01L 43/08; H01L 29/82; H01L 23/5226; H01L 23/528; H01L 27/222; H01L 43/02; G11C 11/16
 USPC ....................... 257/421–427, E29.323; 438/3; 360/324–326, 313; 365/157–158, 365/171–173
 See application file for complete search history.

(56) References Cited

U.S. PATENT DOCUMENTS

| | | | |
|---|---|---|---|
| 8,013,407 B2* | 9/2011 | Takenaga | G11C 11/16 257/20 |
| 8,758,850 B2 | 6/2014 | Zhou et al. | |
| 8,786,036 B2 | 7/2014 | Cao et al. | |
| 8,866,207 B2 | 10/2014 | Hu et al. | |
| 8,871,365 B2 | 10/2014 | Wang et al. | |
| 8,941,196 B2 | 1/2015 | Bedau et al. | |
| 8,953,285 B2* | 2/2015 | Zhou | B82Y 10/00 360/319 |
| 9,082,888 B2* | 7/2015 | Kent | G11C 11/16 |

(Continued)

OTHER PUBLICATIONS

Sbiaa (2015 J. Phys. D: Appl. Phys. 48 195001 (http://iopscience.iop.org/0022-3727/48/19/195001) published Apr. 1, 2015).*

(Continued)

*Primary Examiner* — Jami M Valentine
(74) *Attorney, Agent, or Firm* — Patterson & Sheridan, LLP (57) ABSTRACT

Embodiments disclosed herein generally relate to a multi-layer magnetic device, and specifically to a spin-torque transfer magnetoresistive random access memory (STT-MRAM) device which provides for a reduction in the amount of current required for switching individual bits. As such, a polarizing reference layer consisting of a synthetic antiferromagnet (SAF) structure with an in-plane magnetized ferromagnet film indirectly exchange coupled to a magnetic film with perpendicular magnetic anisotropy (PMA) is disclosed. By tuning the exchange coupling strength and the PMA, the layers of the SAF may both be canted such that either may be used as a tilted polarizer for either an in-plane free layer or a free layer with PMA.

4 Claims, 5 Drawing Sheets

(56) References Cited

U.S. PATENT DOCUMENTS

| | | | | |
|---|---|---|---|---|
| 2011/0007560 A1* | 1/2011 | Dieny | ................... | B82Y 25/00 365/171 |
| 2011/0241139 A1* | 10/2011 | Yen | ........................ | H01L 43/08 257/421 |
| 2012/0134201 A1* | 5/2012 | Ogimoto | ................ | B82Y 25/00 365/158 |
| 2012/0218813 A1* | 8/2012 | Oh | ........................ | G11C 11/161 365/158 |
| 2012/0292723 A1* | 11/2012 | Luo | ........................ | H01L 43/08 257/421 |
| 2013/0077391 A1* | 3/2013 | Luo | ........................ | H01L 43/08 365/158 |
| 2013/0161770 A1* | 6/2013 | Meng | ..................... | H01L 43/02 257/421 |
| 2014/0110804 A1 | 4/2014 | Han et al. | | |
| 2014/0198564 A1* | 7/2014 | Guo | ...................... | G11C 11/161 365/158 |
| 2014/0299950 A1 | 10/2014 | Kim et al. | | |
| 2015/0213865 A1* | 7/2015 | Wu | ....................... | G11C 11/161 365/158 |
| 2016/0155485 A1* | 6/2016 | Dieny | ................... | G11C 11/161 365/158 |
| 2016/0276006 A1* | 9/2016 | Ralph | ..................... | G11C 11/18 |

OTHER PUBLICATIONS

Sbiaa et al. (Journal of Applied Physics 105, 013910 (2009); doi: 10.1063/1.3055373 (View online: http://dx.doi.org/10.1063/1.3055373) published Jan. 6, 2009).*

Effect of the synthetic antiferromagnetic polarizer layer rigidness on the spin transfer torque switching current density <http://spintronics.inha.ac.kr/publications/2013_APL_Rigidness.pdf>.

Multilayer Nanomagnetic Systems for Information Processing <http://scholarcommons.usf.edu/cgi/viewcontent.cgi?article=6305&context=etd>.

* cited by examiner

TILTED SYNTHETIC ANTIFERROMAGNET POLARIZER/REFERENCE LAYER FOR STT-MRAM BITS

BACKGROUND

Field

Embodiments disclosed herein generally relate to data storage and computer memory systems, and more particularly, to an MRAM device with improved spin torque efficiency.

Description of the Related Art

The heart of a computer is a magnetic recording device which typically may include a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that requires power to retain stored data. Non-volatile memory, on the other hand, may generally refer to types of computer memory that do not require power in order to retain stored data. Examples of volatile memory may include certain types of random access memory (RAM), such as dynamic RAM (DRAM) and static RAM (SRAM). Examples of non-volatile memory may include read-only memory (ROM), magnetoresistive RAM (MRAM), and flash memory, such as NOR and NAND flash, etc.

In recent years there has been a demand for higher density devices, which maintain a relatively low cost per bit, for use in high capacity storage and memory applications. Today the memory technologies that generally dominate the computing industry are DRAM and NAND flash; however these memory technologies may not be able to address the current and future capacity demands of next generation computing systems.

Recently, a number of emerging technologies have drawn increasing attention as potential contenders for next generation memory. One such memory technology is magnetoresistive random access memory (MRAM). MRAM offers fast access time, infinite read/write endurance, radiation hardness, and high storage density. Unlike conventional RAM chip technologies, MRAM data is not stored as an electric charge, but instead stores data bits using magnetic charges. The elements are formed from two magnetically polarized layers, each of which can maintain a magnetic polarization field, separated by a thin insulating layer, which together form a magnetic tunnel junction (MTJ) structure. MRAM cells including MTJ memory elements can be designed for in-plane or perpendicular magnetization of the MTJ layer structure with respect to the film surface. One of the two layers (referred to as a fixed or reference layer) has its magnetization fixed and set to a particular polarity, for example by coupling the layer to an antiferromagnet; the polarization of the second layer (referred to as a free layer) is free to rotate under the influence of an external writing mechanism such as a strong magnetic field or a spin polarized electric current (which is used in a form of MRAM know as spin-torque transfer or STT-MRAM). Therefore, the cells are typically designed to have two stable states (i.e. a "0" or a "1" defined by the resistance of the MTJ) that allow the cells to serve as non-volatile memory cells.

Additionally, a hindrance to the scaling of STT-MRAM densities to values approaching DRAM is the amount of current required for switching individual bits, as the current available for switching is limited by complementary metal oxide semiconductor (CMOS) sense transistors with values on the order of tens of microamps at 20 nm node sizes. Due to these limitations, it is critical to reduce the amount of current required to switch the magnetization state of the bits without affecting the switching reliability, endurance, and signal to noise (SNR) of the bit. Many strategies have been introduced to reduce switching currents, such as moving from layers polarized in the film plane to layers polarized perpendicular to the film plane, as this reduces the torque required to switch the free layer. However, this method alone is not sufficient to lower the switching currents to the values mentioned above. Additional methods for reducing switching currents have been proposed such as inducing weak perpendicular magnetic anisotropy (PMA) on the switching (free) layer to tilt it slightly from its equilibrium position, or utilizing a tilted polarizing reference layer in a MRAM bit. Although modeling results have shown these concepts can help to reduce switching currents, there is a need for a physical system that incorporates the property of a tilted magnetic layer. Therefore, there is a need in the art for an improved STT-MRAM device which utilizes a reduced switching current.

SUMMARY

Embodiments disclosed herein generally relate to a multilayer magnetic device, and specifically to a spin-torque transfer magnetoresistive random access memory (STT-MRAM) device which provides for a reduction in the amount of current required for switching individual bits. As such, a polarizing reference layer consisting of a synthetic antiferromagnet (SAF) structure with an in-plane magnetized ferromagnet film indirectly exchange coupled to a magnetic film with perpendicular magnetic anisotropy (PMA) is disclosed. By tuning the exchange coupling strength and the PMA, the layers of the SAF may both be canted such that either may be used as a tilted polarizer for either an in-plane free layer or a free layer with PMA.

In one embodiment, a multilayer magnetic device is disclosed. The multilayer device includes a synthetic antiferromagnet structure. The synthetic antiferromagnet structure includes an in-plane ferromagnet layer, a nonmagnetic metal layer disposed on the in-plane ferromagnet layer, and a perpendicular magnetic anisotropy ferromagnet layer disposed on the metal layer. Both the in-plane ferromagnet layer and the perpendicular magnetic anisotropy ferromagnet layer may each be tilted away from a respective equilibrium axis. Furthermore, the perpendicular magnetic anisotropy ferromagnet layer may be magnetized out-of-plane.

In another embodiment, a multilayer magnetic device is disclosed. The multilayer magnetic device includes a reference layer structure. The reference layer structure includes a perpendicular magnetic anisotropy polarizing layer, a nonmetallic metal layer disposed on the perpendicular magnetic anisotropy polarizing layer, and a perpendicular magnetic anisotropy ferromagnet layer disposed on the metal layer. At least one of the perpendicular magnetic anisotropy polarizing layer or the perpendicular magnetic anisotropy ferromagnet layer may be tilted away from a respective equilibrium axis.

In yet another embodiment, a magnetoresistive random access memory storage device is disclosed. The magnetoresistive random access memory storage device includes a synthetic antiferromagnet structure, a spacer layer, and a free layer. The synthetic antiferromagnet structure includes a first layer, a nonmagnetic metal layer disposed on the first layer, and a perpendicular magnetic anisotropy ferromagnet layer disposed on the metal layer. The first layer may include an in-plane ferromagnet layer or a tilted perpendicular magnetic anisotropy polarizing layer. The metal layer may include ruthenium. Furthermore, both the first layer and the perpendicular magnetic anisotropy ferromagnet layer may each be tilted away from a respective equilibrium axes. Additionally, the spacer layer may be between the synthetic antiferromagnet structure and the free layer.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments in any field.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following disclosure, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

Embodiments disclosed herein generally relate to a multilayer magnetic device, and specifically to a spin-torque transfer magnetoresistive random access memory (STT-MRAM) device which provides for a reduction in the amount of current required for switching individual bits. As such, a synthetic antiferromagnet (SAF) structure with an in-plane magnetized ferromagnet film indirectly exchange coupled to a magnetic film with perpendicular magnetic anisotropy (PMA) is disclosed. By tuning the exchange coupling strength and the PMA, the layers of the SAF may both be canted such that either may be used as a tilted reference layer for either an in-plane free layer or a free layer with the PMA. The reference layer may act as a filter to spin polarize electric current which may then exert spin torque on the free layer in order to flip the polarization of the free layer. Thus, the terms reference layer and polarizing layer may be used interchangeably throughout.

In the following description of aspects of the present disclosure, reference is made to the accompanying drawings that form a part hereof, and in which is shown by way of illustration of the specific implementations in which the disclosure may be practiced. It should be noted that the figures discussed herein are not drawn to scale and do not indicate actual or relative sizes. Any hatching in the figures is used to distinguish layers and does not represent the type of material used. A plurality of arrays of MRAM cells are typically fabricated simultaneously on a single wafer. The figures and description herein reference only a few cells of the plurality of cells that will typically be fabricated simultaneously on a single wafer.

Figure 1:
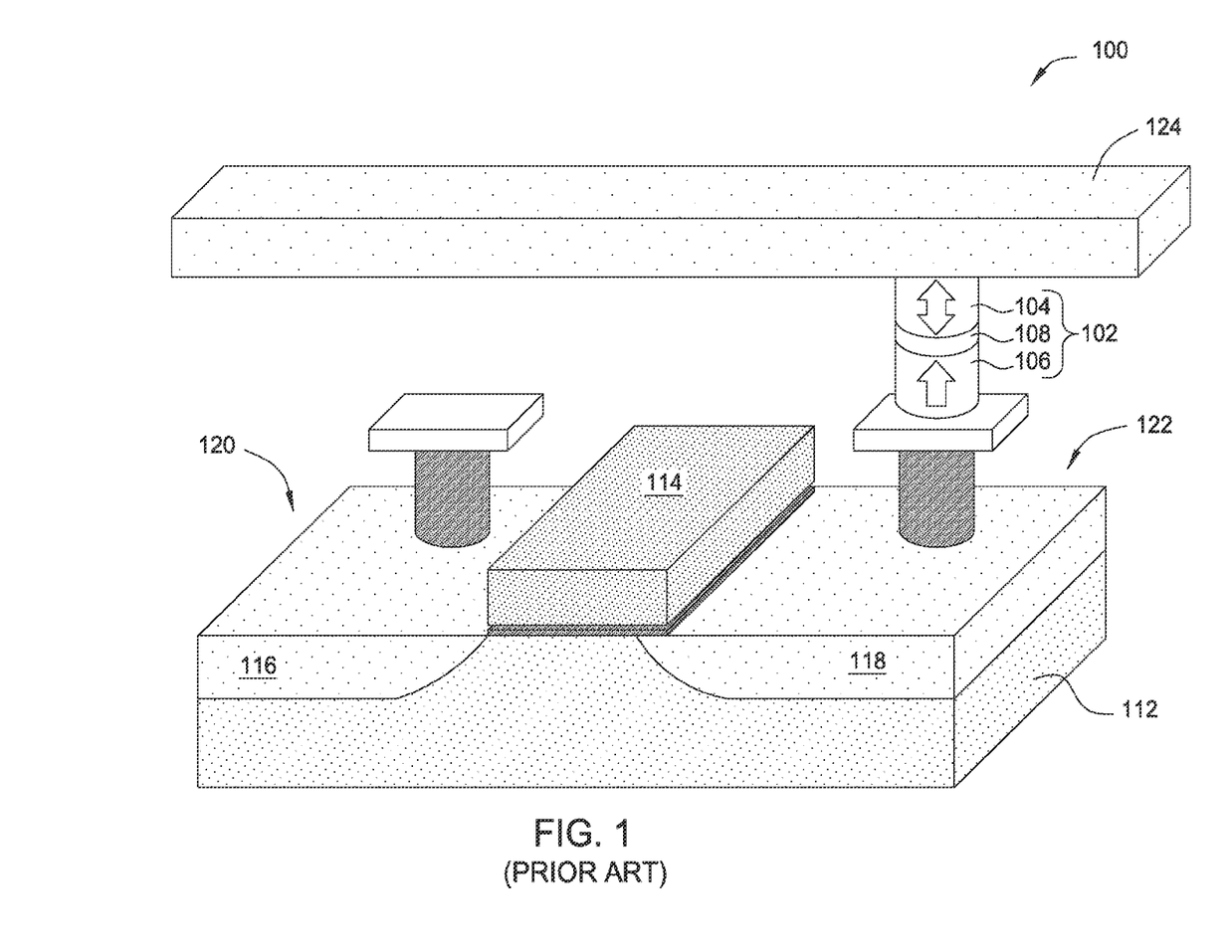
FIG. 1 illustrates a spin-torque transfer magnetoresistive random access memory (MRAM) device according to one embodiment described herein.

FIG. 1 illustrates a spin-torque transfer magnetoresistive random access memory (STT-MRAM) cell 100. The STT-MRAM cell 100 may include a magnetic tunnel junction (MTJ) 102. The MTJ 102 may include a sub-100 nanometer size magnetic element. The MTJ 102 may further include a free layer 104 and a reference layer 106 separated by a thin insulating layer 108 or tunnel barrier. Both the free layer 104 and the reference layer 106 may each be comprised of one or more magnetic layers. Information may be stored in the relative orientation of the magnetic state of the free layer 104 with respect to the magnetic state of the reference layer 106.

A memory device may be built from a grid of such STT-MRAM cells 100. The STT-MRAM cells 100 may be an array on a chip connected by metal word lines (not shown) and metal bit lines 124. Each STT-MRAM cell 100 may be connected to a word line and a bit line 124. The word lines may connect rows of cells, and the bit lines 124 may connect columns of cells. The word line may be coupled to the gate 114. Typically, complementary metal-oxide semiconductor (CMOS) structures include a selection transistor which is electrically connected to the MTJ 102 though the top or bottom metal contacts. The direction of the current flow may be between top or bottom metal electrodes.

Reading the polarization state of the STT-MRAM cell 100 is accomplished by measuring the electrical resistance of the STT-MRAM cell's 100 MTJ 102. A particular cell is conventionally selected by powering an associated transistor that drives current from a supply line through the MTJ 102 to a ground. Due to the tunneling magnetoresistance effect, the electrical resistance of the STT-MRAM cell 100 may change due to the relative orientation of the polarizations in the free layer 104 and the reference layer 106 of the MTJ 102. By measuring the resulting voltage, the resistance inside any particular STT-MRAM cell 100 may be determined, and from this the polarity of the free (writable) layer 104 determined. If the free layer 104 and the reference layer 106 of the MTJ 102 have the same polarization, the bit is considered to be in State "0," and the resistance is "low." However, if the free layer 104 and the reference layer 106 are of opposite polarization, the resistance may be higher than that of State "0" which correlates to State "1."

The reference layer 106 may provide a reference frame required for reading and writing. The STT effect may enable the magnetic state of free layer 104 to be changed if the torque is sufficiently strong, thus permitting the writing of information. Within the MTJ 102 resistance may be low when the magnetization of the reference layer 106 and free layer 104 are aligned in the same direction. However, resistance may be high when the magnetization of the reference layer 106 and the free layer 104 are aligned in opposite directions.

STT-MRAM cells 100 may utilize one transistor and one MTJ 102 in which a CMOS transistor may be used as a select device and drives the write currents through a bit for writing information. Opposite bits of information may be written using currents of opposite directions. The bit itself may include the MTJ 102, in which information is encoded as the relative orientation of the free layer 104 with respect to the reference layer 106. At scaled technology nodes, the magnetization of the free layer 104 and the reference layer 106 may be perpendicular to the sample plane (up or down) to take advantage of the built-in magnetic anisotropy of the material. Furthermore, each STT-MRAM cell 100 may include a substrate 112. In certain embodiments the substrate 112 may be a silicon substrate. The substrate 112 may be coupled to a gate 114. A source 116 may be coupled to the substrate 112 on a first side 120 of the gate, and a drain 118 may be coupled to the substrate 112 on a second side 122 of the gate, the second side 122 being opposite the first side 120.

Figure 2A:
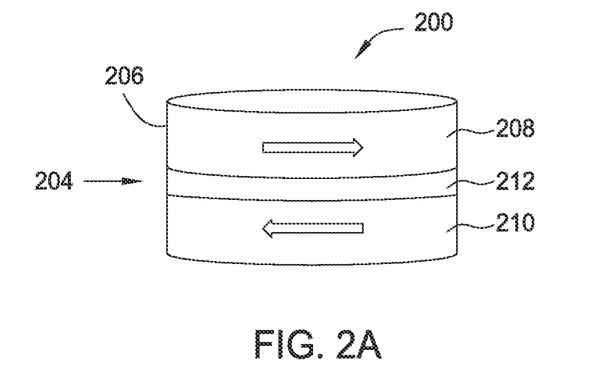
FIGS. 2A-2C illustrate embodiments of layers of synthetic antiferromagnets.
Figure 2B:
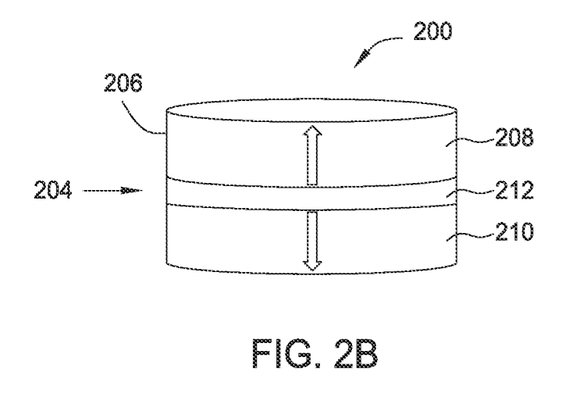
Figure 2C:
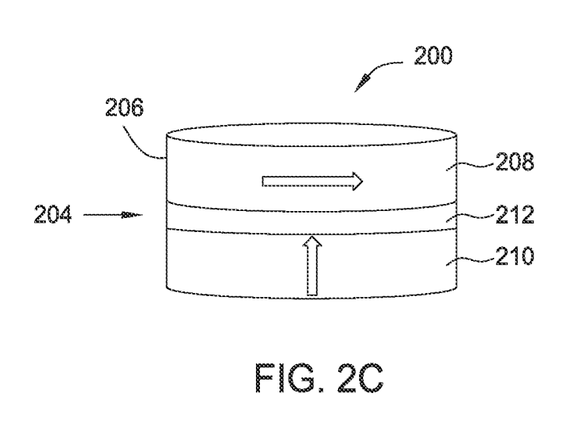

FIGS. 2A and 2B illustrate embodiments of portions of a magnetic device 200 comprising layers of a SAF structure 204 for obtaining a tilted polarizer in a standard non-tapered pillar 206. As shown, the SAF structure 204 may indirectly exchange couple a first ferromagnetic layer 208 and a second ferromagnetic layer 210, through a nonmagnetic metallic layer 212. In some embodiments, the nonmagnetic metallic layer 212 may be an insulating layer such as an oxide film. The nonmagnetic metallic layer 212 may comprise ruthenium metal. The first ferromagnet layer 208 and the second ferromagnetic layer 210 may be utilized as a polarizer layer in both read heads and MRAM bits. As illustrated by the reference arrows of FIG. 2A, both the first ferromagnetic layer 208 and the second ferromagnetic layer 210 may be in-plane layers. Furthermore, as illustrated by the reference arrows of FIG. 2B, both the first ferromagnetic layer 208 and the second ferromagnetic layer 210 may be out of plane layers. FIG. 2C, on the other hand, illustrates an embodiment of the present disclosure in which layers of the SAF structure 204 for obtaining a tilted polarizer in a standard non-tapered pillar 206. However, as shown in FIG. 2C, the first ferromagnetic layer 208 and the second ferromagnetic layer 210 may not be collinear with one another. The non-collinearity may be of a range from between about 90 degrees to about 45 degrees. In some embodiments, the first ferromagnetic layer 208 and the second ferromagnetic layer 210 may be approximately perpendicular to each other.

The use of the SAF structure 204 with a magnetization tilted slightly away from the equilibrium axis of the free layer magnetization allows for an amount of spin polarization oriented perpendicular to the direction of the free layer moment to increase the spin torque efficiency of the current bias by pulling the free layer either more out of plane in the case of an in-plane free layer and more in-plane in the case of a free layer with PMA. This perpendicular component of the polarization may help reduce the incubation or ring-up time (the amount of time the moment oscillates before reversing) for the switching dynamics, thus resulting in a faster switch. This may be equivalent to a reduction in switching current for the same switching time compared to a MTJ without a tilted polarizer.

Figure 3:
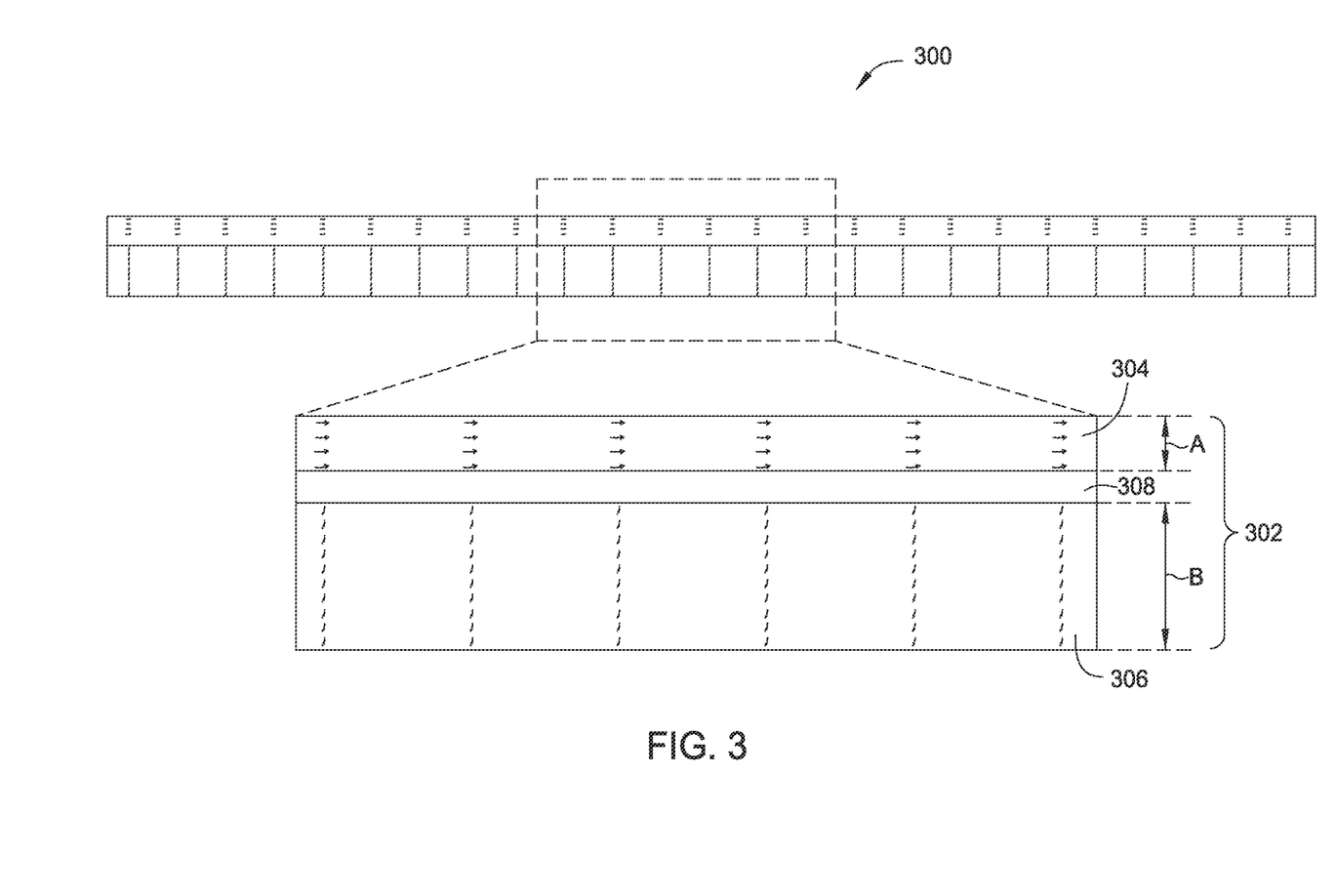
FIG. 3 illustrates a reference layer structure according to one embodiment described here.

FIG. 3 illustrates a portion of a multilayer magnetic device 300 having a reference layer structure 302 therein, according to one embodiment. The reference layer structure 302 may be a SAF structure, such as SAF structure 204 as shown in FIGS. 2A-2C. In one embodiment, the reference layer structure 302 may be patterned into an elliptical pillar. In another embodiment, the reference layer structure 302 may be patterned into a circle. In certain embodiments, the reference layer structure 302 may comprise a first ferromagnet layer 304, a second ferromagnet layer 306, and a nonmagnetic metal layer 308, each corresponding to the first ferromagnet layer 208, the second ferromagnet layer 210, and the insulating layer 212, respectively, as discussed above with reference with FIGS. 2A-2C. The metal layer 308 may be disposed on the first ferromagnet layer 304. The second ferromagnet layer 306 may be magnetized out-of-plane. The second ferromagnet layer 306 may be disposed on the metal layer 308. In certain embodiments, each of the first ferromagnet layer 304 and the second ferromagnet layer 306 may be tilted away from a respective equilibrium axis.

In certain embodiments, discussed infra, the first ferromagnet layer 304 may be an in-plane ferromagnet layer and/or a tilted perpendicular magnetic anisotropy polarizing layer. In other embodiments, discussed infra, the second ferromagnet layer 306 may be a perpendicular magnetic anisotropy (PMA) ferromagnet layer.

As shown in FIG. 3, the first ferromagnet layer 304 may have a thickness A of between about 0.5 nm and about 10.0 nm, for example between about 1.0 nm and about 6.0 nm, such as between about 2.0 nm and 5.0 nm. The first ferromagnet layer 304 may maintain a saturation magnetization ($M_S$) greater than about 700 emu/cm$^3$, such as between about 1000 emu/cm$^3$ and about 1300 emu/cm$^3$, for example about 1140 emu/cm$^3$. The saturation magnetization may allow the first ferromagnet layer 304 to take advantage of the out of plane demagnetization field, thus keeping the first ferromagnet layer 304 polarized in the plane of the film. In certain embodiments the first ferromagnet layer 304 may comprise one of Ni, Fe, Co, B, Ge, Mn, and/or alloys of Ni, Fe, Co, B, Ge, or Mn, and/or combinations and mixtures thereof. In some embodiments, the first ferromagnet layer 304 may comprise Ni, Fe, Co, or an alloy comprising a combination of thereof together with B, Ge, and/or Mn.

As further shown in FIG. 3, the second ferromagnet layer 306 may be a single ferromagnet with a bulk PMA, such as FePt. In some embodiments the PMA may be introduced using interfacial anisotropy at a CFB/MgO interface or within superlattices of Co/Pt, Co/Pd, or Co/Ni. The second ferromagnet layer 306 may have a thickness B of between about 2.0 nm and about 10.0 nm, for example between about 4 nm and about 6 nm, such as about 5.0 nm. The second ferromagnet layer 306 may maintain a saturation magnetization ($M_S$) greater than about 500 emu/cm$^3$, such as between about 550 emu/cm$^3$ and about 1200 emu/cm$^3$, for example about 650 emu/cm$^3$. Furthermore, the second ferromagnet layer 306 may maintain an anisotropy energy of between about $1 \times 10^5$ erg/cm$^3$ and about $5 \times 10^7$ erg/cm$^3$, for example $4 \times 10^6$ erg/cm$^3$. In certain embodiments the second ferromagnet layer may be a single ferromagnet comprising Ni, Fe, Co, or an alloy comprising a combination of thereof together with B, Ge, Pt and/or Mn or superlattices of Co and Pt, Co and Pd, Co and Ni, and/or combinations and mixtures thereof.

The metal layer 308 may separate the first ferromagnet layer 304 and the second ferromagnet layers 306. In some embodiments, the metal layer 308 may comprise ruthenium. The metal layer 308 may maintain a coupling strength of between about 0.1 erg/cm$^2$ and about 1 erg/cm$^2$, such as about 0.5 erg/cm$^2$. Furthermore, the metal layer may maintain a thickness of between about 2 angstroms and about 10 angstroms. However, the thickness of the metal layer 308 may be selected to set the exchange coupling strength to compensate for the PMA.

As such, the first ferromagnet layer 304 and the second ferromagnet layer 306 may be tilted from equilibrium by between about 5 degrees and about 35 degrees, for example between about 15 degrees and about 20 degrees. As such, the tilt angle may be tuned by adjusting the anisotropy energy of the second ferromagnet layer 306 and the coupling strength of the metal layer 308.

Figure 4:
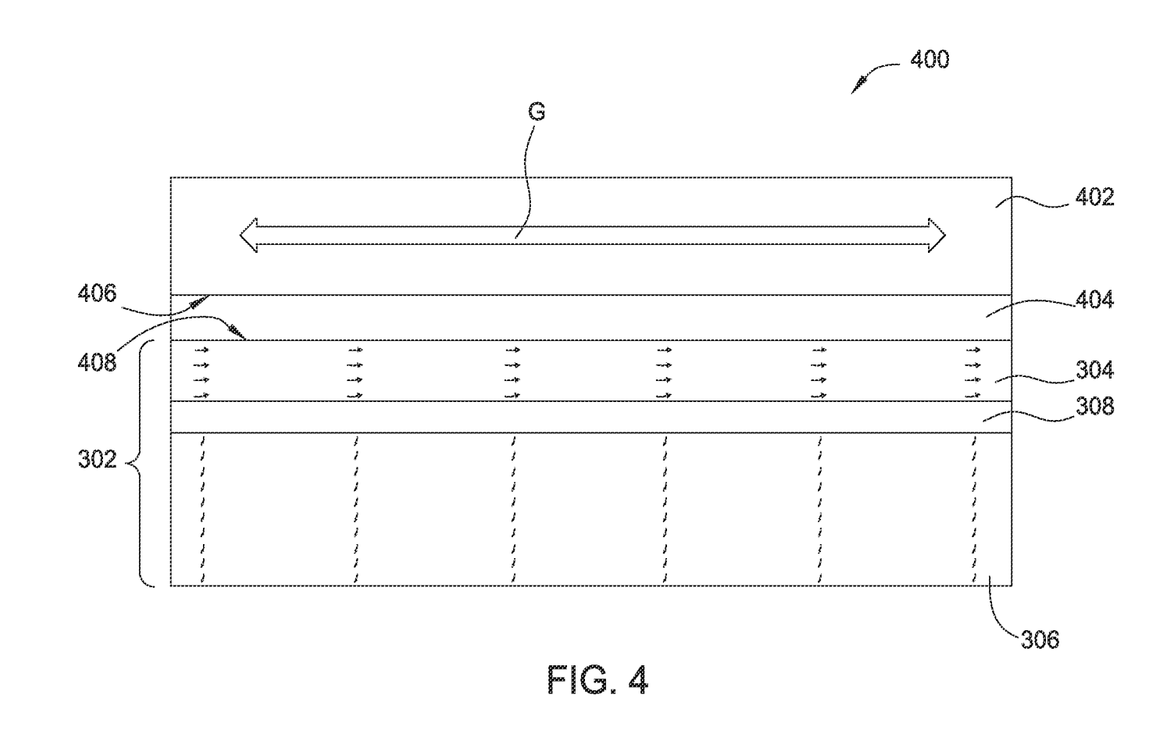
FIG. 4 illustrates a magnetic tunnel junction (MTJ) MRAM bit with an in-plane free layer according to one embodiment described herein.

FIG. 4 illustrates a STT-MRAM bit cell 400 with a free layer 402 that is oriented in-plane, as indicated by reference arrow G, according to one embodiment. As shown, the MTJ MRAM bit structure 400 may be implanted into the MRAM system. In the embodiment of FIG. 4, the reference layer structure 302 may comprise the first ferromagnet layer 304, the second ferromagnet layer 306, and the nonmagnetic metal layer 308, as discussed with reference to FIG. 3. In the embodiment of FIG. 4, however, the first ferromagnet layer 304 may be an in-plane ferromagnet layer. Furthermore, the second ferromagnet layer 306 may be a PMA ferromagnet layer. The PMA ferromagnet layer may be magnetized out of plane. Both the in-plane ferromagnet layer and the PMA ferromagnet layer may each be tilted away from a respective equilibrium axis. The free layer 402 may be placed adjacent the reference layer structure 302 to take advantage of the canting. The in-plane free layer 402 may be coupled with a spacer layer 404, such as an insulating layer, on a first side 406 of the spacer layer 404 such that electric current spin polarized by the tilted in-plane first ferromagnetic layer 304 can interact with the free layer. The free layer 402 of FIG. 4 may maintain the properties of the free layer 104 discussed with reference to FIG. 1. The reference layer structure 302 may be coupled with the spacer layer 404 on a second side 408 of the spacer layer 404, the second side 408 being opposite the first side 406. In certain embodiments, the spacer layer 404 may comprise an MgO material, an oxide material, Cu, Ag, and/or combinations and mixtures thereof. In certain embodiments, the spacer layer 404 may be a tunnel junction insulating structure. The spacer layer 404 of FIG. 4 may maintain the properties of the spacer layer 108 discussed with reference to FIG. 1.

In embodiments comprising a free layer 402 that is in-plane, as shown in FIG. 4, the reference layer structure 302 may utilize a tilted in-plane layer as the PMA ferromagnetic layer 306. Furthermore, it should be noted that the MTJ MRAM bit structure 400 of FIG. 4 may be inverted without losing the enhancement in spin torque efficiency described herein.

Figure 5:
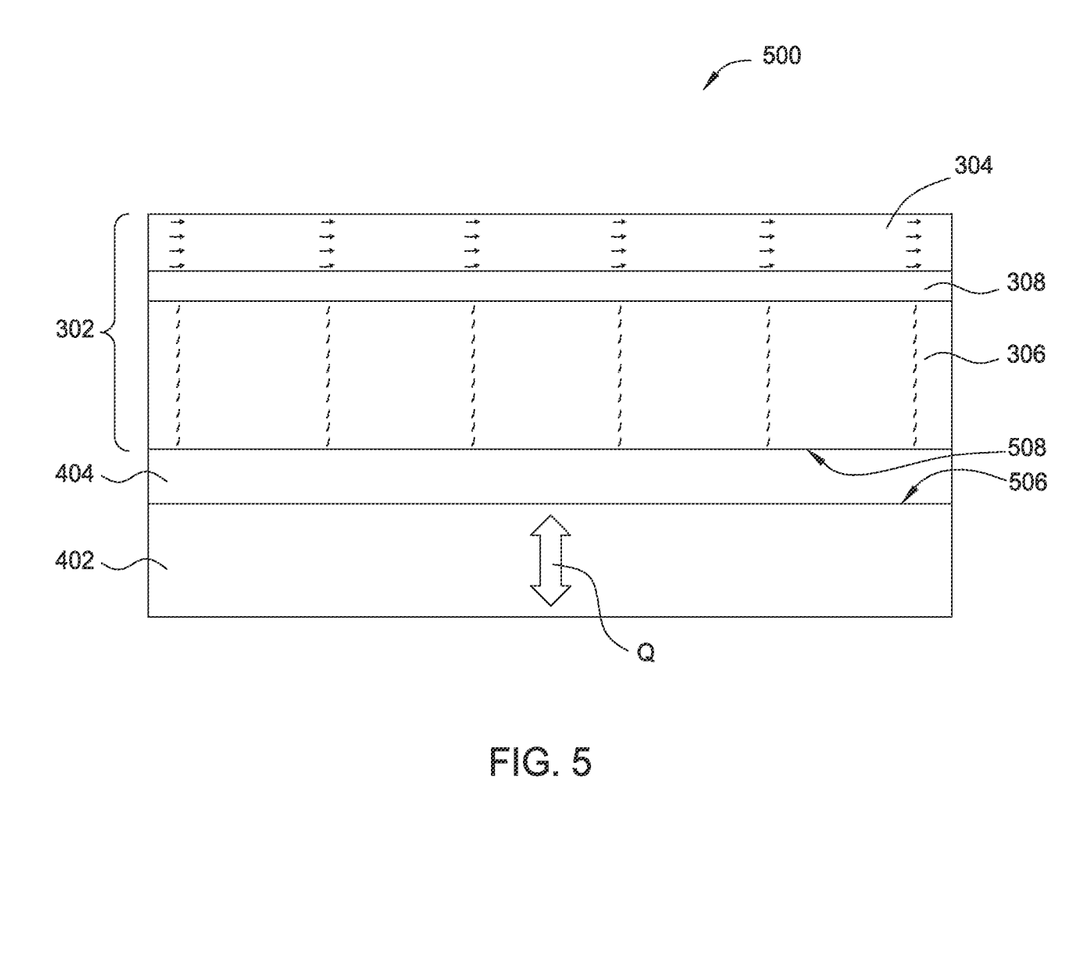
FIG. 5 illustrates a magnetic tunnel junction (MTJ) MRAM bit with an out-of-plane free layer according to one embodiment described herein.

FIG. 5 illustrates a MTJ MRAM bit structure 500 with a free layer 402 that is out-of-plane, as indicated by reference arrow Q, according to one embodiment. As shown, the STT-MRAM bit cell 500 may be implanted into the MRAM system. In the embodiment of FIG. 5, the reference structure 302 may comprise the first ferromagnet layer 304, the second ferromagnet layer 306, and the metal layer 308, as discussed with reference to FIG. 3. In the embodiment of FIG. 5, however, the first ferromagnet layer 304 may be a perpendicular magnetic anisotropy polarizing layer. Furthermore, the second ferromagnet layer 306 may be a PMA ferromagnet layer. At least one of the perpendicular magnetic anisotropy polarizing layer or the PMA ferromagnet layer may be tilted away from a respective equilibrium axis. The free layer 402 may be a PMA free layer placed adjacent the reference layer structure 302 to take advantage of the canting off the axis perpendicular to the plane. The free layer 402 may be coupled with the spacer layer 404, such as an insulating layer, on a first side 506 of the spacer layer 404 such that electric current spin polarized by the tilted PMA ferromagnetic layer 306 can interact with the free layer. The free layer 402 of FIG. 5 may maintain the properties of the free layer 104 discussed with reference to FIG. 1. The reference layer structure 302 may be coupled with the spacer layer 404 on a second side 508 of the spacer layer 404, the second side 508 being opposite the first side 506. In certain embodiments, the spacer layer 404 may comprise an MgO material, an oxide material, Cu, Ag, and/or combinations and mixtures thereof. In certain embodiments, the spacer layer 404 may be a tunnel junction insulating structure.

In embodiments comprising a free layer 402 that is out-of-plane, as shown in FIG. 5, the free layer 408 may comprise PMA. Furthermore, the reference layer structure 302 may utilize a tilted PMA layer as a polarizer. Furthermore, it should be noted that the MTJ MRAM bit structure 500 of FIG. 5 may be inverted without losing the enhancement in spin torque efficiency described herein.

Benefits of the present disclosure include the generation of tilting at the film level using a polarizer structure with two magnetic layers indirectly exchange coupled through a thin metal layer, such as ruthenium, commonly referred to as a synthetic antiferromagnet (SAF). A SAF structure with a first magnet in-plane and a second magnet comprising PMA and being magnetized out of plane may be utilized. In this way, by properly tuning both the PMA and the ruthenium coupling, both layers may be canted slightly from their preferred equilibrium positions. Furthermore, the SAF polarizer system may be used in bits both with in-plane and PMA free layers in order to improve spin torque efficiency and decrease current.

While the foregoing is directed to embodiments of the disclosure, other and further embodiments may be devised without departing from the basic scope thereof, and the scope thereof is determined by the claims that follow.

What is claimed is:
1. A multilayer magnetic device, comprising:
a reference layer structure comprising:
an in-plane ferromagnet layer, wherein the in-plane ferromagnet layer has an equilibrium axis parallel with a first surface;
a nonmagnetic metal layer disposed on the first surface of the in-plane ferromagnet layer; and
a perpendicular magnetic anisotropy ferromagnet layer disposed on the nonmagnetic metal layer, wherein the perpendicular magnetic anisotropy ferromagnet layer has an equilibrium axis perpendicular to the first surface, wherein magnetizations of both the in-plane ferromagnet layer and the perpendicular magnetic anisotropy ferromagnet layer are each tilted away from respective equilibrium axes, and wherein the in-plane ferromagnet layer maintains a saturation magnetization ($M_S$) between about 1000 emu/cm$^3$ and about 1300 emu/cm$^3$.

2. A multilayer magnetic device, comprising:
a reference layer structure comprising:
an in-plane ferromagnet layer, wherein the in-plane ferromagnet layer has an equilibrium axis parallel with a first surface;
a nonmagnetic metal layer disposed on the first surface of the in-plane ferromagnet layer; and
a perpendicular magnetic anisotropy ferromagnet layer disposed on the nonmagnetic metal layer, wherein the perpendicular magnetic anisotropy ferromagnet layer has an equilibrium axis perpendicular to the first surface, wherein magnetizations of both the in-plane ferromagnet layer and the perpendicular magnetic anisotropy ferromagnet layer are each tilted away from respective equilibrium axes, and wherein the perpendicular magnetic anisotropy ferromagnet layer maintains an anisotropy energy between about $1 \times 10^5$ erg/cm$^3$ and about $5 \times 10^7$ erg/cm$^3$.

3. A magnetoresistive random access memory storage device, comprising:
a reference layer structure, comprising:
a first layer, comprising an in-plane ferromagnet layer or a tilted perpendicular magnetic anisotropy polarizing layer, wherein the in-plane ferromagnet layer has an equilibrium axis parallel with a first surface, wherein the tilted perpendicular magnetic anisotropy polarizing layer has an equilibrium axis perpendicular to the first surface;
a nonmagnetic metal layer disposed on the first surface of the first layer, wherein the metal layer comprises ruthenium; and
a perpendicular magnetic anisotropy ferromagnet layer disposed on the metal layer, wherein the perpendicular magnetic anisotropy ferromagnet layer has an equilibrium axes perpendicular to the first surface, wherein magnetizations of both the first layer and the perpendicular magnetic anisotropy ferromagnet layer are each tilted away from respective equilibrium axes;
a spacer layer; and
a free layer, wherein the spacer layer is coupled to the reference layer structure and the free layer, wherein the perpendicular magnetic anisotropy ferromagnet layer maintains a saturation magnetization ($M_S$) greater than about 500 emu/cm$^3$ and an anisotropy energy between about $1 \times 10^5$ erg/cm$^3$ and about $5 \times 10^7$ erg/cm$^3$.

4. A magnetoresistive random access memory storage device, comprising:
a reference layer structure, comprising:
a first layer, comprising an in-plane ferromagnet layer or a tilted perpendicular magnetic anisotropy polarizing layer, wherein the in-plane ferromagnet layer has an equilibrium axis parallel with a first surface, wherein the tilted perpendicular magnetic anisotropy polarizing layer has an equilibrium axis perpendicular to the first surface;
a nonmagnetic metal layer disposed on the first surface of the first layer, wherein the metal layer comprises ruthenium; and
a perpendicular magnetic anisotropy ferromagnet layer disposed on the metal layer, wherein the perpendicular magnetic anisotropy ferromagnet layer has an equilibrium axes perpendicular to the first surface, wherein magnetizations of both the first layer and the perpendicular magnetic anisotropy ferromagnet layer are each tilted away from respective equilibrium axes;
a spacer layer; and
a free layer, wherein the spacer layer is coupled to the reference layer structure and the free layer, wherein the nonmagnetic metal layer maintains an exchange coupling strength between about 0.1 erg/cm$^2$ and about 1 erg/cm$^2$, and wherein the metal layer has a thickness of between about 2 angstroms and about 10 angstroms.

* * * * *